United States Patent [19]

Shannon

[11] Patent Number: 4,783,688
[45] Date of Patent: * Nov. 8, 1988

[54] SCHOTTKY BARRIER FIELD EFFECT TRANSISTORS

[75] Inventor: John M. Shannon, Whyteleafe, England

[73] Assignee: U.S. Philips Corporation, New York, N.Y.

[*] Notice: The portion of the term of this patent subsequent to Dec. 4, 2001 has been disclaimed.

[21] Appl. No.: 634,740

[22] Filed: Jul. 26, 1984

Related U.S. Application Data

[63] Continuation of Ser. No. 326,467, Dec. 2, 1981.

[51] Int. Cl.[4] .................................. H01L 29/64
[52] U.S. Cl. ............................. 357/15; 357/22; 357/89; 357/91
[58] Field of Search .................... 357/15, 22, 89, 91

[56] References Cited

U.S. PATENT DOCUMENTS

| Re. 28,500 | 7/1975 | Bresee et al. | 357/22 |
|---|---|---|---|
| 3,943,552 | 3/1976 | Shannon et al. | 357/15 |
| 3,964,084 | 6/1976 | Andrews et al. | 357/15 |
| 4,156,879 | 5/1979 | Lee | 357/15 |
| 4,193,079 | 3/1980 | Yeh | 357/22 |
| 4,292,642 | 9/1981 | Appels et al. | 357/22 |
| 4,422,089 | 12/1983 | Vaes et al. | 357/22 |
| 4,486,766 | 12/1984 | Shannon | 357/15 |

Primary Examiner—Gene M. Munson
Attorney, Agent, or Firm—Paul R. Miller

[57] ABSTRACT

A high-grain MESFET (i.e. a Schottky barrier FET) has a gate electrode present directly on a semiconductor body. A highly doped layer, which forms parts of the channel of the transistor, extends below the gate electrode between the source and drain regions respectively. A highly doped surface region of opposite conductivity type to the highly doped layer is present between the gate electrode and the highly doped layer. This surface region, which is so thin that it is fully depleted in the zero gate bias condition, raises the effective height of the Schottky barrier. The highly doped layer is so thin that it can support without breakdown an electric field greater than the critical field for avalanche breakdown of the semiconductor material for this layer. Thus, the doping concentration of the highly doped layer can be increased so that more charge can be depleted from it. The highly doped surface region extends beyond the gate electrode on the drain side of the semiconductor to reduce the surface electric field. Another layer, which is more lightly doped than the highly doped layer of the same conductivity type, increases the mobility of charge carriers in the channel.

3 Claims, 1 Drawing Sheet

SCHOTTKY BARRIER FIELD EFFECT TRANSISTORS

This application is a continuation application of Ser. No. 326,467, filed Dec. 7, 1981, now U.S. Pat. No. 4,486,766, and all benefits for such earlier application are hereby claimed for this continuation application.

This invention relates to a Schottky barrier field effect transistor in which the Schottky barrier is formed between a semiconductor body portion and a metal-based gate electrode provided thereon with the body portion comprising a first semiconductor layer of one conductivity type extending below the gate electrode to provide at least a part of the channel of the transistor.

A Schottky barrier field effect transistor in which the gate electrode is present directly on the semiconductor body portion is sometimes referred to as a MESFET which is an acronym from metal semiconductor field effect transistor. MESFETs are unipolar devices, that is to say, current flow in MESFETs is by way of majority carriers only. Because of this there are no minority charge storage problems and so a MESFET is particularly suitable for certain applications, for example for high frequency devices.

A MESFET having the features mentioned in the opening paragraph is described on pages 410 to 412 of S. M. Sze's book "Physics of Semiconductor Devices", published by Wiley. In particular a gallium arsenide transistor is described in which the semiconductor layer extending below the gate electrode is an n-type gallium arsenide epitaxial layer $2 \times 10^{-4}$ cm thick with a doping concentration of $2 \times 10^{15}$ donors cm$^{-3}$. With these values for the thickness and doping concentration it is possible to deplete about $4 \times 10^{11}$ charge carriers cm$^{-2}$ from the epitaxial layer.

In this known MESFET the maximum electric field which can be supported by the first semiconductor layer without it breaking down is determined by the onset of avalanche breakdown. The lowest field at which avalanche breakdown occurs in a particular semiconductor material is known as the critical field. (For moderately doped silicon and gallium arsenide this is approximately $4 \times 10^5$ V cm$^{-1}$). To prevent avalanche breakdown occurring as the voltage across the first semiconductor layer is increased it is necessary for this layer to be fully depleted of charge carriers at a field which is less than the critical field. This requirement clearly imposes an upper limit on the doping concentration of the first layer which, in turn, limits the total number of charge carriers which can be depleted from the first semiconductor layer (approximately $2.5 \times 10^{12}$ cm$^{-2}$ for silicon and gallium arsenide).

Unfortunately the gain of a MESFET is related to the total number of impurities which can be depleted by the gate. This is apparent from the following known relationship.

$$g_{max} = (2Z\mu/L)Q(a)'$$

where g is the mutual conductance, Z is the channel width, L is the channel length, $\mu$ is the mobility, and $Q(a)$ is the total number of charge carriers cm$^{-2}$ in the channel. It is clear then that the occurrence of avalanche breakdown also limits the gain of the known MESFET.

According to the present invention there is provided a Schottky barrier field effect transistor in which the Schottky barrier is formed between a semiconductor body portion and a metal-based gate electrode provided thereon, said body portion comprising a first semiconductor layer of one conductivity type extending below said gate electrode to provide at least a part of the channel of the transistor, which first layer is so thin that it is capable of supporting without breakdown an electric field in excess of the critical field for avalanche breakdown of the semiconductor material of said layer, wherein the effective height of the barrier is raised by a surface-adjoining region of the opposite conductivity type between the first layer and said electrode, which region is so shallow that it is substantially depleted of charge carriers in the zero gate bias condition.

The invention is based on the recognition of the fact that by incorporating a barrier raising region the gate leakage can be negligible and the first semiconductor layer can have a high doping concentration while avoiding avalanche breakdown if this layer is sufficiently thin.

In fact, if the potential difference across the first semiconductor layer is less than $E_g/q$ (where $E_g$ is the energy gap of the semiconductor and q is the electronic charge) then there is not enough energy available for the charge carriers in this layer to form electron-hole pairs so that avalanche breakdown cannot occur. Furthermore, because of the small thickness of the first semiconductor layer, the probability of ionization is very small so that it is even possible for the potential difference across this layer to exceed $E_g/q$ without breakdown occurring. Therefore, the doping concentration of the first semiconductor layer can be increased above that at which avalanche breakdown occurs in the known MESFET as long as this first semiconductor layer is so thin that it is substantially depleted of charge by a potential which is sufficiently small that it is not capable of producing a significant number of electron-hole pairs. In other words, the first semiconductor layer is capable of supporting without breakdown an electric field in excess of the critical field for avalanche breakdown of the semiconductor material of this layer. The possibility of increasing the doping concentration of the first layer means that a MESFET in accordance with the invention is capable of depleting more charge carriers than the known transistor and so its gain is significantly increased. The maximum field which the layer can support now becomes limited by the onset of the field emission process, i.e. at about $2.5 \times 10^6$ Vcm$^{-1}$ for silicon and about $1.5 \times 10^6$ Vcm$^{-1}$ for gallium arsenide, which is higher than the critical field, i.e. $4 \times 10^5$ Vcm$^{-1}$ for silicon.

The surface-adjoining region of the opposite conductivity type to that of the first semiconductor layer acts to raise the effective height of the Schottky barrier formed between the gate electrode and the subjacent semiconductor body portion. In fact the amount by which the effective height can be raised depends on the doping concentration of this region which must be present across the whole area of the gate electrode. The region in question must be so shallow that it is substantially depleted of charge carriers in the zero gate bias condition. Similarly it should be fully depleted under all operating conditions. In one particlar form of the invention this surface-adjoining region provides means for reducing the electric field at the surface of the semiconductor body portion in the vicinity of the gate electrode.

The body portion of the MESFET preferably comprises a second semiconductor layer of the first conductivity type adjoining the first layer, the second layer being more lightly doped than said first layer. In this case the second layer also provides part of the channel of the transistor. The result of this is that carriers from the first semiconductor layer tend to "spill-over" into the lower doped second layer. As there are fewer impurities in this second layer the mobility of the charge carriers therein is relatively high. Thus the overall effect of the second, "spill-over" layer is to increase the mobility of the charge carriers giving the advantage that MESFETs incorporating such a spill-over layer can operate at higher speeds making them even more suitable for high fequency applications. Because electrons have a greater mobility than holes and because the MESFET is a unipolar device this increased mobility effect is optimized when the first and second semiconduct or layers are of the n-conductivity type.

Embodiments of the invention will now be described, by way of example, with reference to the accompanying drawings, in which.

It should be noted that the Figures are diagrammatic and not drawn to scale. The relative dimensions and proportions of some parts of these Figures have been shown exaggerated or reduced for the sake of clarity and convenience. Also to preserve the clarity of the Figures the different parts of the semiconductor body portion have not been hatched.

Figure 1:
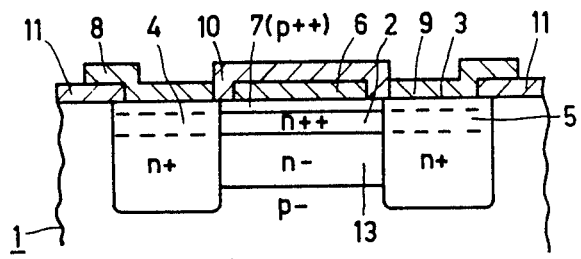
FIG. 1 is a cross-sectional view of a Schottky barrier field effect transistor in accordance with the invention.

FIG. 1 is a sectional view of a MESFET in accordance with the invention. A first n++ layer 2 is present in a semiconductor body portion 1 which comprises, for example, a p-type monocrystalline silicon substrate with a resistivity of for example 20 ohm.cm. The thickness of the part of the layer 2 which extends below the gate electrode 6 must be less than about $10^{-5}$ cm so that it is capable of supporting an electric field in excess of $4 \times 10^5$ Vcm$^{-1}$ which is the critical field for avalanche breakdown in moderately doped bulk silicon. The layer 2, which at the part below the gate electrode 6 may have a thickness of, for example, $1.8 \times 10^{-6}$ cm and a doping concentration of $8 \times 10^{18}$ donor atoms cm$^{-3}$, extends into n+ type source and drain regions 4, 5 respectively. These regions 4 and 5 extend up to the surface 3 of the semiconductor body portion.

With these values for the thickness and the doping concentration the layer 2 is depleted at a voltage of 2.5 V and it is capable of supporting without breakdown a field of approximately $2.2 \times 10^6$ Vcm$^{-1}$.

A Schottky barrier is formed at the surface 3 between the body portion 1 and the metal based gate electrode 6 which may be made of, for example, molybdenum. A p++ region 7 adjoining the surface 3 is present between the gate electrode 6 and the layer 2 and it extends across the whole area of the gate electrode 6. In this embodiment the region 7, as seen in projection, extends beyond the gate electrode and into the source and drain regions 4,5. Thus during operation of the transistor, i.e. when a voltage is applied between the source and drain regions and a suitable bias voltage is applied to the gate electrode 6, the extended portion of region 7 acts to reduce the electric field at the surface of the semiconductor body portion 1 in the vicinity of the gate electrode 6. To fulfil this same purpose and in contrast with the MESFET shown in FIG. 1, the extended portion of region 7 may be present only on the drain side of gate electrode 6. The region 7 may be, for example $3 \times 10^{-7}$ cm thick. To increase the effective height of the Schottky barrier adequately the doping concentration of region 7 is, for example $3 \times 10^{19}$ acceptors cm$^{-3}$. With this doping concentration and thickness the region 7 is substantially depleted of charge carriers in the zero gate bias condition.

Source and drain electrodes 8,9, which may be made of aluminium, contact the source and drain regions 4,5 respectively. The electrodes 8 and 9 are insulated from the gate electrode 6 by the insulating layer 10 present thereon and from the remainder of the silicon body portion by the insulating layer 11. Layers 10 and 11 may be, for example, silicon oxide. A second n-type semiconductor layer 13 adjoins the n++ layer 2. This layer 13 is an n-layer and is more lightly doped than layer 2. Typically the doping concentration of layer 13 is $5 \times 10^{14}$ donors cm$^{-3}$. The thickness of layer 13 should be greater than the mean free path of electrons in this layer. At the specified dopant concentration the electronic mean free path is approximately $5 \times 10^{-6}$ cm and so the thickness of layer 13 may be $10^{-5}$ cm. The mobility of the electrons in layer 13 is then approximately 1,400 cm$^2$V$^{-1}$s$^{-1}$ as compared with approximately 100 cm$^2$V$^{-1}$s$^{-1}$ for the layer 2. Thus the overall mobility of the electrons is increased by the presence of layer 13 as mentioned above so that this MESFET is particularly suitable for high frequency operation.

When a voltage is applied between the source and drain regions 4,5, and a suitable bias voltage is applied to the gate electrode 6, then the current flow between the source and drain is controlled by the gate voltage. Current flow occurs in the channel of the transistor. In the embodiments described the part of the layer 2 extending below the gate electrode 6 forms part of the channel of the transistor, the remaining part being formed by the n-layer 13. In operation, as the magnitude of the reverse bias on the gate is increased the depletion layer associated with the Schottky barrier extends further into the layer 2 and eventually it extends through layer 2 into the n-layer 13. When the depletion layer extends all the way through layer 13 the transistor switches off as current flow between the source and drain is inhibited. Thus the MESFET described operates in the depletion mode.

Figure 2:
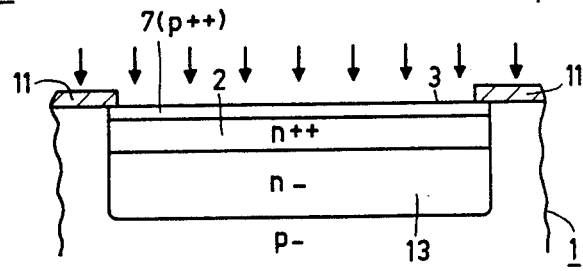
FIGS. 2 and 3 are cross-sectional views showing different stages during the manufacture of the transistor of FIG. 1.
Figure 3:
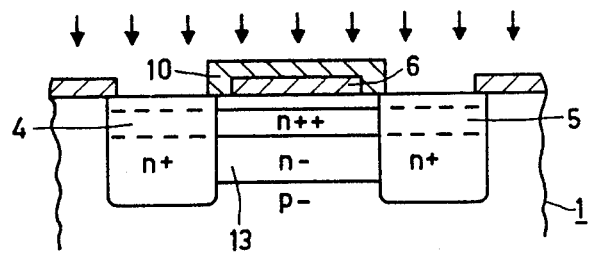

A method of manufacturing the MESFET of FIG. 1 will now be described with reference to FIGS. 2 and 3.

The starting material is a p-silicoN substrate 1 having a resistivity of, for example 20 ohm.cm. A silicon oxide layer 11 is provided on the surface 3 of the body 1 in the usual manner and a window 12 is defined in the oxide using conventional photolithographic and etching techniques (see FIG. 2). Thereafter ion implantation is used to define the layers 13 and 2 and the region 7. During these ion implantation stages the oxide layer 11 acts as a mask. The following conditions may be used for these implants. Firstly for layer 13 arsenic ions may be implanted using a dose of $10^{10}$ cm$^{-2}$ at 20 keV. This implant may be driven in to a depth of, for example $1.21 \times 10^{-5}$ cm by heating at 1100° C. The subsequent step is the implantation of arsenic ions using a dose of $1.4 \times 10^{13}$ cm$^{-2}$ at 6 keV to form the layer 2. The next step is to implant boron ions using a dose of $9 \times 10^{12}$ cm$^{-2}$ at 0.5 keV. Thus region 7 is formed. In FIG. 2 the arrows represent the various ion implants. The resulting structure may be annealed for 15 minutes at 700° C. Afterwards the molybdenum gate electrode 6 is defined in a conventional manner and this electrode is then covered with a passivating layer, for example an oxide layer 10 (See FIG. 3). The next step is to form the source and drain regions 4,5 by implantation of phosphorus ions using a dose of $5 \times 10^{15}$ cm$^{-2}$ at 25 keV. Again the arrows in FIG. 3 represent the ion implant. The resulting structure may then be annealed by heating at 700° C. for 15 minutes. In the example shown the source and drain regions 4,5 extend deeper into the semiconductor body portion 1 than the n-layer 13.

Referring now to FIG. 1, the MESFET is completed by providing aluminium source and drain electrodes 8,9 using methods well known to those skilled in the art.

As a modification of this method the p++ implant may be restricted to the area where the final p++ region 7 is to be formed. Clearly this can be done by masking the areas of the body 1 where the source and drain regions 4,5 are to be formed. In this case it is not necessary to perform an additional implantation step as the source and drain regions 4,5 already extend upto the surface 3.

Figure 4:
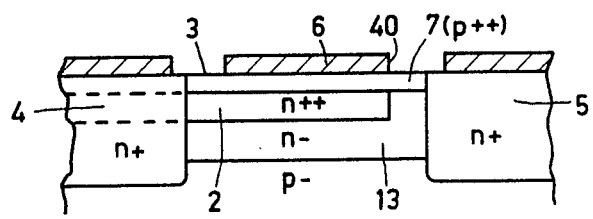
FIG. 4 is a cross-sectional view of a modified form of the transistor of FIG. 1.

FIG. 4 shows a modified form of the MESFET of FIG. 1. In this case the effect of surface field reduction in the vicinity of the gate electrode is further enhanced because the layer 2, as seen in projection, terminates at the edge 40 of the gate electrode 6. This edge 40 is the edge of the electrode 6 nearest the drain 5. On the source side of electrode 6 the layer 2 extends beyond the edge of the electrode 6 into the source region 4. This arrangement has the advantage that higher voltages can be applied to the drain before breakdown occurs. To manufacture the MESFET of FIG. 4 the previously described method is modified as follows. After forming the n-layer 13 the region 7 is formed by ion implantation. Next an implantation mask with a narrower window than that used to define layer 13 and region 7 is provided on the surface 3 and ion implantation is used, as before, to form layer 2. This same mask can be retained during the formation of the gate electrode 6 so that the edge of layer 2 and the edge 40 of this electrode are in registration.

Figure 5:
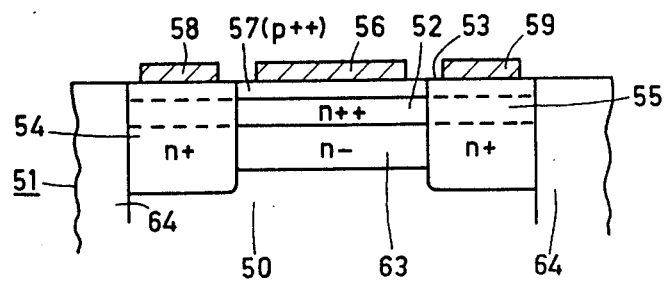
FIG. 5 is a cross-sectional view of another Schottky barrier field effect transistor in accordance with the invention.

A different MESFET in accordance with the invention is shown in FIG. 5. In this embodiment the semiconductor body portion 51 is gallium arsenide. This MESFET comprises a first n++ layer 52 of gallium arsenide present in the body portion 51 which comprises, for example, a semi-insulating gallium arsenide substrate 50. The thickness of layer 52, must be less than approximately $10^{-5}$ cm so that it is capable of supporting an electric field in excess of $4 \times 10^5$ Vcm$^{-1}$ which is the critical field for avalanche breakdown of moderately doped gallium arsenide. The layer 52, which may have a doping concentration of $10^{18}$ donor atoms cm$^{-3}$ and a thickness of $3.8 \times 10^{-6}$ cm, comprises n-type source and drain regions 54,55 respectively. With these values for the thickness and the doping concentration the layer 52 is capable of supporting without breakdown a field of approximately $6.5 \times 10^5$ Vcm$^{-1}$. Also with these values for thickness and doping concentration the layer 52 is substantially depleted of charge carriers in the zero gate bias condition in thermal equilibrium. Thus this MESFET operates in the enhancement mode.

A Schottky barrier is formed at the surface 53 between the body portion 51 and the metal-based electrode 56 which may be made of, for example, aluminum. A p++ region 57 adjoining the surface 53 is present between the gate electrode 56 and the layer 52 and it extends beyond the area of electrode 56 into the source and drain regions 54,55. As in the previous embodiment the extended portion of region 57 may be present only on the drain side of electrode 56. The region 57 may be, for example, $5 \times 10^{-7}$ cm thick with a doping concentration of $7 \times 10^{18}$ acceptors cm$^{-3}$. With this doping concentration and thickness the region 7 is substantially depleted of charge carriers in the zero gate bias condition.

A second n-type layer 63 adjoins the n++ layer 52. Typically the doping concentration of this layer 63 is $5 \times 10^{14}$ donors cm$^{-3}$, while its thickness is, for example $10^{-5}$ cm. Again, as described previously, layer 63 serves to increase the mobility of the electrons in the MESFET thereby increasing the speed at which the device can operate.

The layers 52 and 63 and the region 7, all of which are gallium arsenide, may be grown on a semi-insulating gallium arsenide substrate using the known technique of molecular beam epitaxy (MBE). The source and drain regions 54,55 may be formed by ion implantation and isolation regions 64 may be provided using proton bombardment. The details of these techniques are well known to the person skilled in the art. The device of FIG. 5 is completed by providing the gate electrode 56 and source and drain electrodes 58,59 respectively. These latter electrodes may also be formed from nickel-gold-germanium. Any conventional technique may be used for the provision of these electrodes.

It should be noted that the invention is not restricted to particular embodiments described above. In fact, many modifications and variations, which will be apparent to those skilled in the art, are possible within the scope of this invention. For example, as an alternative to the surface field reducing means described in the above embodiments a passivating layer such as an oxide layer may be present on the surface of the semiconductor body portion at least in the vicinity of the gate electrode. Furthermore the material of the first semiconductor layer may be different from that of the second semiconductor layer and the substrate may also be a different material. Clearly, semiconductor materials other than silicon and gallium arsenide may be employed. Also, the different parts of the MESFET may all have the opposite conductivity type to that mentioned in the above embodiments.

I claim:

1. A Schottky barrier field effect transistor comprising:
   a semiconductor body portion of a first conductivity type,
   a region of a second conductivity type located at a surface of said semiconductor body portion between a source region and a drain region,
   said region of said second conductivity type including a first semiconductor layer of said second conductivity type in contact with said semiconductor body portion and having a high doping, and a metallic gate electrode extending over at least a part of said first semiconductor layer, said first semiconductor layer having a thickness sufficiently thin to support without breakdown an electric field in excess of a critical field for avalanche breakdown of said first semiconductor layer, said thickness being less than 100 nm, and said first semiconductor layer providing at least a part of a channel of the transistor, and a second semiconductor layer of said first conductivity type lying between said first semiconductor layer and a gate electrode, said second semiconductor layer forming a surface-adjoining region being so shallow that it is substantially depleted of charge carriers in a zero gate bias condition, said surface-adjoining region having a thickness between 3 nm and 50 nm, wherein a Schottky barrier is formed between said gate electrode and said semiconductor body portion, said Schottky barrier having an effective height raised by said second semiconductor layer, wherein another layer of said second conductivity type lies between said first layer of said second conductivity type and said semiconductor body portion, said another layer being more lightly doped than said first layer of said second conductivity type, and wherein said another semiconductor layer has a doping concentration of less than $10^{15}$ atoms cm$^{-3}$.

2. A Schottky barrier field effect transistor comprising:
a semiconductor body portion of a first conductivity type,
a region of a second conductivity type located at a surface of said semiconductor body portion between a source region and a drain region,
said region of said second conductivity type including a first semiconductor layer of said second conductivity type in contact with said semiconductor body portion and having a high doping, and a metallic gate electrode extending over at least a part of said first semiconductor layer, said first semiconductor layer having a thickness sufficiently thin to support without breakdown an electric field in excess of a critical field for avalanche breakdown of said first semiconductor layer, said thickness being less than 100 nm, and said first semiconductor layer providing at least a part of a channel of the transistor, and
a second semiconductor layer of said first conductivity type lying between said first semiconductive layer and a gate electrode, said second semiconductor layer forming a surface-adjoining region being so shallow that it is substantially depleted of charge carriers in a zero gate bias condition, said surface-adjoining region having a thickness between 3 nm and 50 nm,
wherein a Schottky barrier is formed between said gate electrode and said semiconductor body portion, said Schottky barrier having an effective height raised by said second semiconductor layer, wherein said first semiconductor layer is silicon and wherein said first semiconductor layer extending below said gate electrode has a thickness of less than 25 nm and a doping concentration of more than $2 \times 10^{18}$ atoms cm$^{-3}$.

3. A Schottky barrier field effect transistor comprising:
a semiconductor body portion of a first conductivity type,
a region of a second conductivity type located at a surface of said semiconductor body portion between a source region and a drain region,
said region of said second conductivity type including a first semiconductor layer of said second conductivity type in contact with said semiconductor body portion and having a high doping, and a metallic gate electrode extending over at least a part of said first semiconductor layer, said first semiconductor layer having a thickness sufficiently thin to support without breakdown an electric field in excess of a critical field for avalanche breakdown of said first semiconductor layer, said thickness being less than 100 nm, and said first semiconductor layer providing at least a part of a channel of the transistor, and
a second semiconductor layer of said first conductivity type lying between said first semiconductor layer and a gate electrode, said second semiconductor layer forming a surface-adjoining region being so shallow that it is substantially depleted of charge carriers in a zero gate bias condition, said surface-adjoining region having a thickness between 3 nm and 50 nm,
wherein a Schottky barrier is formed between said gate electrode and said semiconductor body portion, said Schottky barrier having an effective height raised by said second semiconductor layer, wherein said first semiconductor layer is gallium arsenide and wherein said first semiconductor layer extending below said gate electrode has a thickness of less than 50 nm and a doping concentration of more than $5 \times 10^{17}$ atoms cm$^{-3}$.

* * * * *